(12) United States Patent
Nosrati et al.

(10) Patent No.: US 11,692,905 B2
(45) Date of Patent: Jul. 4, 2023

(54) SYSTEM AND METHOD FOR PREDICTING AND CONTROLLING GAS LINE PERFORMANCE

(71) Applicant: Watlow Electric Manufacturing Company, St. Louis, MO (US)

(72) Inventors: Mohammad Nosrati, Redwood City, CA (US); Fatemeh Nosrati, San Jose, CA (US); Jacob Lindley, St. Louis, MO (US); John Lilleland, Morgan Hill, CA (US); Sanhong Zhang, Ballwin, MO (US)

(73) Assignee: WATLOW ELECTRIC MANUFACTURING COMPANY, St. Louis, MO (US)

( * ) Notice: Subject to any disclaimer, the term of this patent is extended or adjusted under 35 U.S.C. 154(b) by 0 days.

(21) Appl. No.: 16/907,976

(22) Filed: Jun. 22, 2020

(65) Prior Publication Data

US 2020/0400530 A1 Dec. 24, 2020

Related U.S. Application Data

(60) Provisional application No. 62/864,896, filed on Jun. 21, 2019.

(51) Int. Cl.
*G01M 7/02* (2006.01)
*G01M 7/00* (2006.01)
(Continued)

(52) U.S. Cl.
CPC .............. *G01M 7/025* (2013.01); *G01M 7/00* (2013.01); *G05B 19/042* (2013.01); *H01L 21/67017* (2013.01); *G05B 2219/49056* (2013.01)

(58) Field of Classification Search
None
See application file for complete search history.

(56) References Cited

U.S. PATENT DOCUMENTS

| 5,837,094 A | 11/1998 | Tsukazaki et al. |
| 6,532,069 B1 | 3/2003 | Otsuki et al. |

(Continued)

FOREIGN PATENT DOCUMENTS

| EP | 3162398 A1 * | 5/2017 | ........ A61M 5/31566 |
| JP | H09196843 | 7/1997 | |

(Continued)

OTHER PUBLICATIONS

A Alwodai, F Gu and A D Ball, A Comparison of Different Techniques for Induction Motor Rotor Fault Diagnosis, 2012, Journal of Physics: Conference Series, vol. 364, 25th International Congress on Condition Monitoring and Diagnostic Engineering (COMADEM 2012) Jun. 18-20, 2012, Huddersfield, UK (Year: 2012).*

(Continued)

*Primary Examiner* — Matthew G Marini
(74) *Attorney, Agent, or Firm* — Burris Law, PLLC

(57) ABSTRACT

A method of monitoring a condition of a dynamic system includes installing a vibration signal acquisition device at a predetermined location of the dynamic system, acquiring vibration signals by the vibration signal acquisition device, analyzing the vibration signals in a frequency domain, and predicting a change in the condition of the dynamic system based on the vibration signals in the frequency domain. A system is also provided, and a condition of the dynamic system includes clogging.

20 Claims, 15 Drawing Sheets

(51) Int. Cl.
*G05B 19/042* (2006.01)
*H01L 21/67* (2006.01)

(56) References Cited

U.S. PATENT DOCUMENTS

| | | | | |
|---|---|---|---|---|
| 7,290,450 | B2* | 11/2007 | Brown | G01F 1/666 |
| | | | | 73/579 |
| 8,026,113 | B2 | 9/2011 | Kaushal et al. | |
| 8,999,858 | B2 | 4/2015 | Koshi et al. | |
| 9,502,273 | B2 | 11/2016 | Nishihara | |
| 2001/0008993 | A1* | 7/2001 | Bottomfield | H01L 21/67276 |
| | | | | 702/56 |
| 2003/0010091 | A1 | 1/2003 | Mitchell | |
| 2004/0064277 | A1* | 4/2004 | Samata | G05B 23/0221 |
| | | | | 702/76 |
| 2005/0201567 | A1 | 9/2005 | Browne et al. | |
| 2007/0224712 | A1* | 9/2007 | Kaushal | H01L 21/67253 |
| | | | | 438/15 |
| 2016/0327452 | A1* | 11/2016 | Vilar | G01M 13/04 |
| 2018/0252611 | A1* | 9/2018 | Cole | G01M 3/2815 |
| 2019/0377064 | A1* | 12/2019 | Scheske | G01S 13/931 |

FOREIGN PATENT DOCUMENTS

| | | |
|---|---|---|
| JP | H1162846 | 3/1999 |
| JP | 2012112796 | 6/2012 |
| TW | 200805437 A | 1/2008 |
| TW | I475159 | 3/2015 |
| TW | 201638472 | 11/2016 |
| TW | 201807512 | 3/2018 |

OTHER PUBLICATIONS

Silva, et al., Vibration analysis for fouling detection using hammer impact test and finite element simulation, IEEE International Instrumentation and Measurement Technology Conference, May 12-15, 2008, Victoria, Vancouver Island, Canada.

International Search Report for International Application PCT/US2020/038948, dated Oct. 13, 2020.

Search Report issued in corresponding Taiwan Application No. 111115031 dated Sep. 13, 2022, 1 page.

* cited by examiner

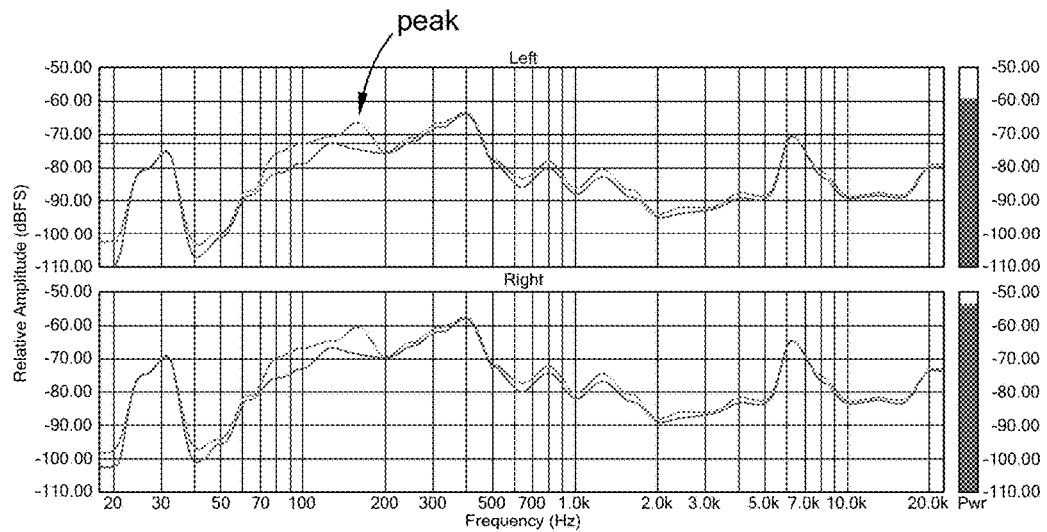
FIG. 3A
FIG. 3B
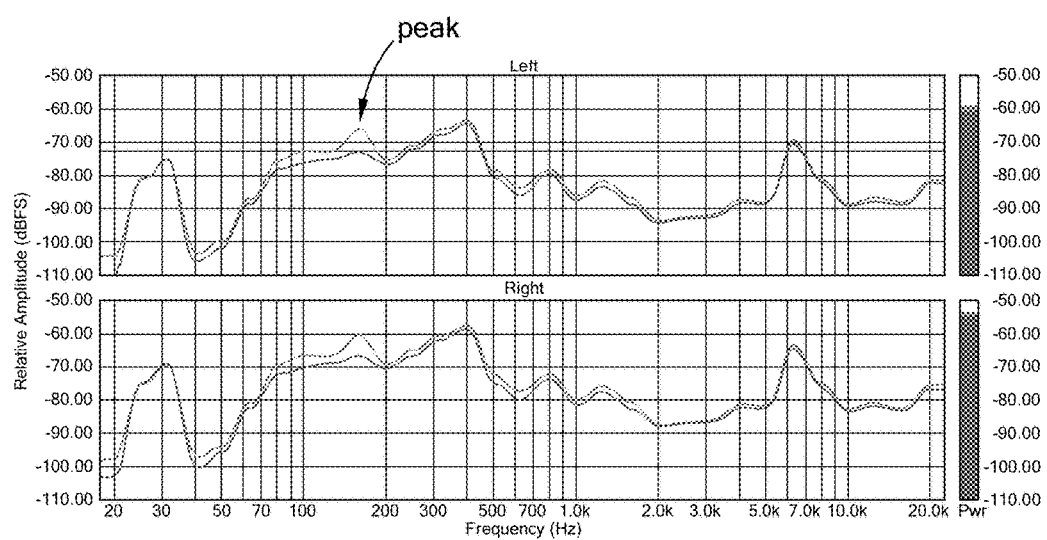
FIG. 4A
FIG. 4B

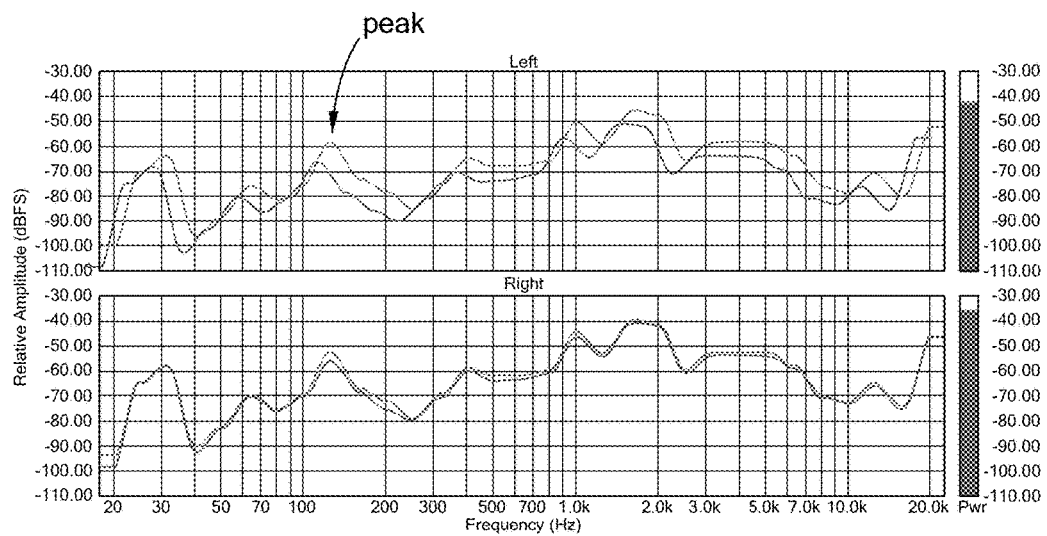
FIG. 5A
FIG. 5B
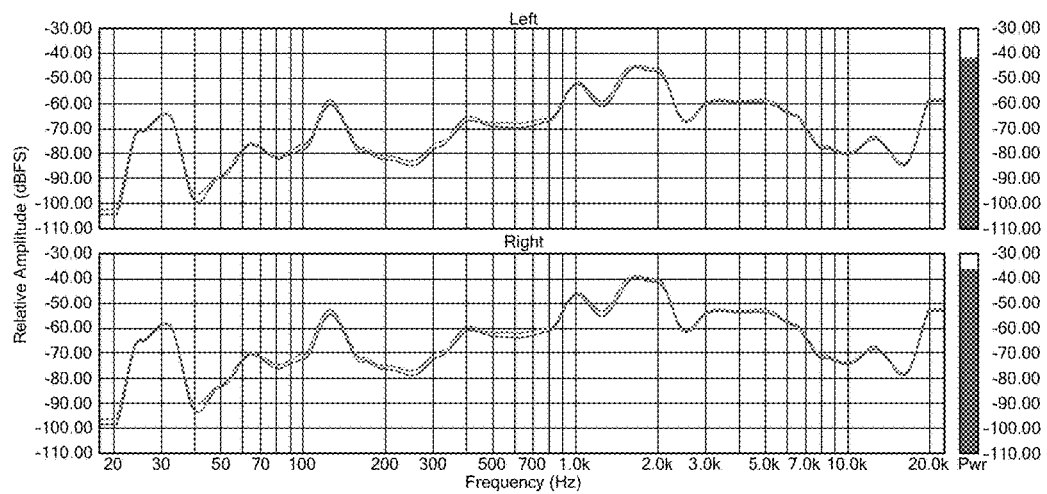
FIG. 6A
FIG. 6B

SYSTEM AND METHOD FOR PREDICTING AND CONTROLLING GAS LINE PERFORMANCE

CROSS-REFERENCE TO RELATED APPLICATIONS

This application claims priority to and the benefit of U.S. provisional application No. 62/864,896 filed on Jun. 21, 2019. The disclosure of the above application is incorporated herein by reference.

FIELD

The present disclosure relates generally to a system and a method for monitoring a condition of a dynamic fluid flow system, for example in semiconductor manufacturing, and more particularly to a system and a method for detecting a clogging condition in fluid lines of the dynamic system.

BACKGROUND

The statements in this section merely provide background information related to the present disclosure and may not constitute prior art.

A semiconductor processing system generally includes a processing chamber and a plurality of gas lines through which processing gases are supplied into the processing chamber and removed from the processing chamber. Precipitation and solidification may occur in these gas lines over time, resulting in undesirable clogging in these gas lines.

Precipitation and solidification are difficult to predict. Generally, an operator becomes aware of clogging of the gas lines only after the clogging has caused the semiconductor processing system to fail (e.g., no flow of processing gases and pressure buildup on the pump). While it is known to detect the pressure upstream and downstream from the pump and to determine the clogging condition based on the pressure difference, this approach often does not detect the problem soon enough.

These issues related to the detection and prevention of fluid line clogging, or degraded fluid flow relative to a nominal/desired flow, are addressed by the present disclosure.

SUMMARY

In one form, a method of monitoring a condition of a dynamic system includes acquiring vibration signals by a vibration signal acquisition device disposed at a predetermined location of the dynamic system, analyzing the vibration signals in at least one of a frequency domain and at time domain, and predicting a change in the condition of the dynamic system based on the analyzed vibration signals.

Another form of the method comprises at least one of identifying a frequency peak in a vibration spectrum and correlating the vibration spectrum to the condition of the dynamic system.

In other forms of the method, the dynamic system includes a processing chamber and a gas exhaust line, and the predetermined location is a location adjacent to the gas exhaust line. In at least one variation of the method, the predetermined location is a location directly on a pump in fluid communication with the gas exhaust line and the predetermined location is a location on a pump platform.

Yet another form of the method comprises obtaining a plurality of vibration spectra under a plurality of test conditions.

In some forms of the method, the vibration signal acquisition device includes a transducer.

At least one form of the method comprises analyzing the vibration signals using a vibration signature analysis module, processing the vibration signals by a digital data acquisition (DAQ) system, and obtaining a baseline vibration spectrum when the dynamic system is operating, and a pump is at rest.

Numerous forms of the method comprise activating a heater in response to the predicted change in the condition of the dynamic system, introducing vibration into the dynamic system with at least one excitation device, and a plurality of excitation devices spaced along a fluid flow conduit of the dynamic system.

In variations of the method, the plurality of excitation devices are instrumented hammers, the at least one excitation device is a vibration motor, and the at least one excitation device is a pump.

In another form, a system for clog detection in a fluid flow conduit of a dynamic system is provided that includes a plurality of operational components and a vibration signal acquisition device disposed at a predetermined location of at least one of the plurality of operational components, wherein vibration signals from the vibration signal acquisition device are analyzed in at least one of a frequency domain and a time domain, and presence of a clog is predicted based on the analyzed vibration signals.

Other forms of the system comprise at least one excitation device and in some forms a plurality of excitation devices are spaced along the fluid flow conduit of the dynamic system. In one form, the excitation device is a solenoid hammer. In another form, the excitation device is a piezoelectric stack transducer.

In other forms, a monitoring system for monitoring a condition of a process line includes a target element disposed inside the process line, a proximity sensor disposed outside the process line and opposing the target element to define an empty space therebetween, and wherein the proximity sensor predicts the condition of the process line based on a change in at least one of electrical property of the target element and a dielectric constant of the empty space.

In at least one form of the monitoring system, the proximity sensor is selected from the group consisting of a capacitive proximity sensor, an ultrasonic proximity sensor, and an inductive proximity sensor, the condition is condensation or precipitation in the process line, and the proximity sensor is a capacitive proximity sensor including an internal plate opposing the target element, the empty space being defined between the internal plate and the target element.

In variations of the monitoring system, the proximity sensor is an ultrasonic proximity sensor including a piezoelectric element opposing the target element, and wherein the ultrasonic proximity sensor generates high frequency pulses toward the target element, and predicts the condition of the process line based on time elapse of the high frequency pulses reflected by the target element, wherein the high frequency pulses are exemplified as significant vibration spectra peak increases on a plot of relative amplitude as a function of frequency (Hz).

In another form of the monitoring system, the proximity sensor is an inductive proximity sensor including an inductive coil opposing the target element, an oscillator, a signal converter, and an output circuit, and wherein the inductive proximity sensor predicts the condition of the process line based on an amplitude of oscillation signals generated by the oscillator.

In numerous forms of the monitoring system, the inductive coil is configured to generate an eddy current in the target element, and the eddy current in the target element affects the amplitude of the oscillation signals.

Alternatively, in another aspect of the present disclosure, a monitoring system for monitoring a condition of a process line includes at least one fiber optic cable, a light source disposed at a first end of the fiber optic cable for emitting a light through the fiber optic cable, and an analyzer for analyzing transmission of light from the light source through the at least one fiber optic cable, and for predicting the condition of the process line based on at least one of the transmission of light and a reflection of light through the at least one fiber optical cable.

One variation of the monitoring system includes a two-way mirror disposed at a second end of the at least one fiber optic cable and disposed inside the process line.

In at least one aspect of the monitoring system, the analyzer is disposed at the first end of the fiber optic cable for receiving light emitted from the light source and reflected by the two-way mirror, wherein the analyzer predicts the condition of the process line based on an amount of light reflected by the two-way mirror, the at least one fiber optic cable includes a first fiber optic cable and a second fiber optic cable that are arranged to define a gap between adjacent ends of the first and second fiber optic cables, the gap being located inside the process line, and the light source is disposed at an end of the first fiber optic cable distal from the gap, and the analyzer is disposed at an end of the second fiber optic cable distal from the gap for receiving the light emitted from the light source through the first fiber optic cable, the gap, and the second fiber optic cable, wherein the analyzer predicts the condition of the process line based on the amount of light transmitted through the gap.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figures 2A, 2B:
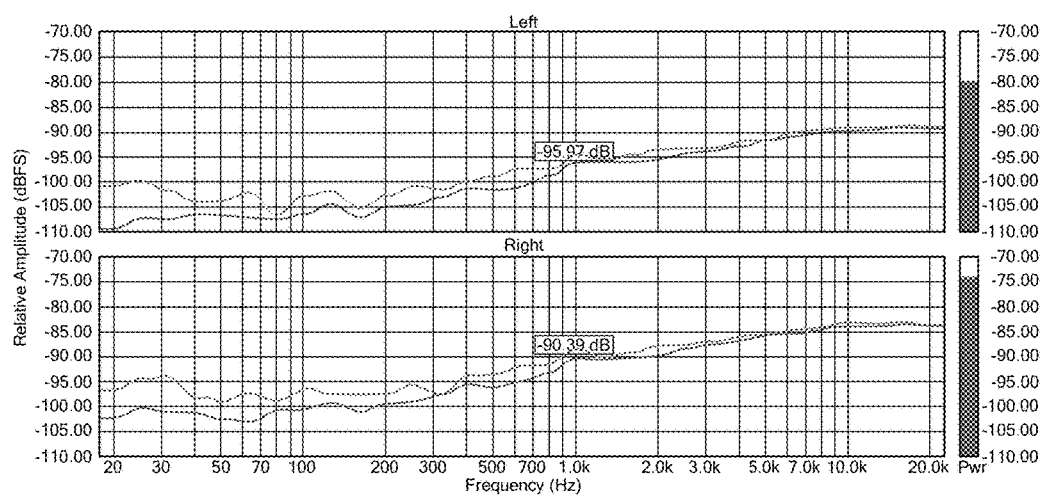
Figure 7:
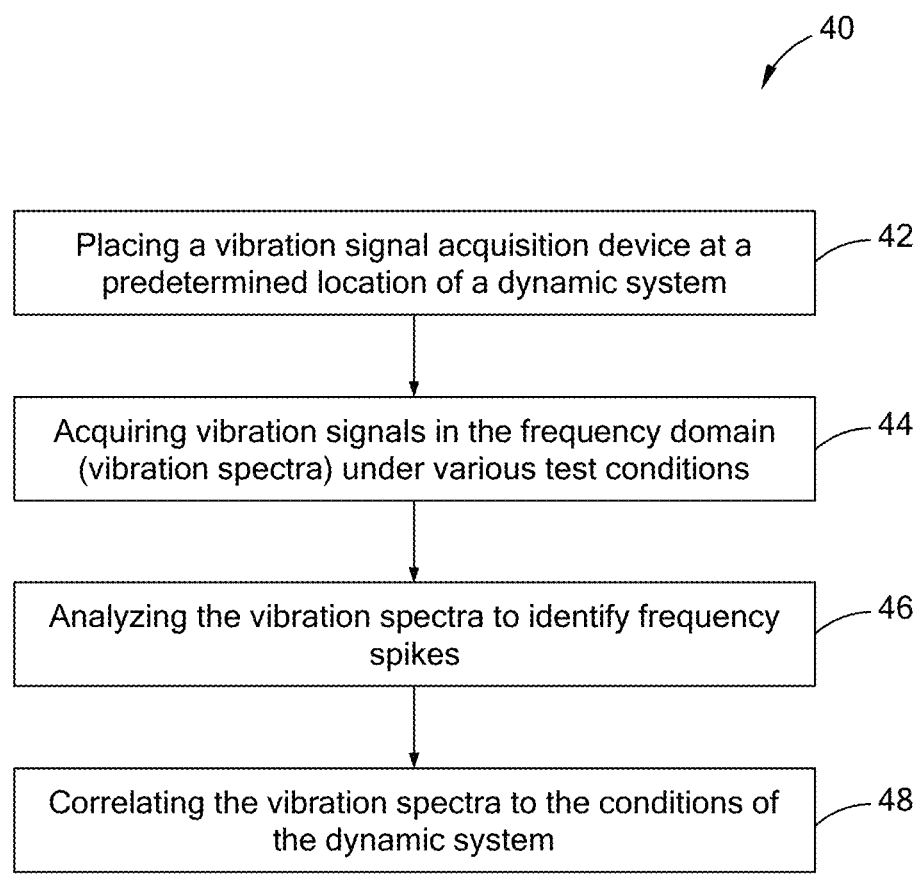
Figure 8:
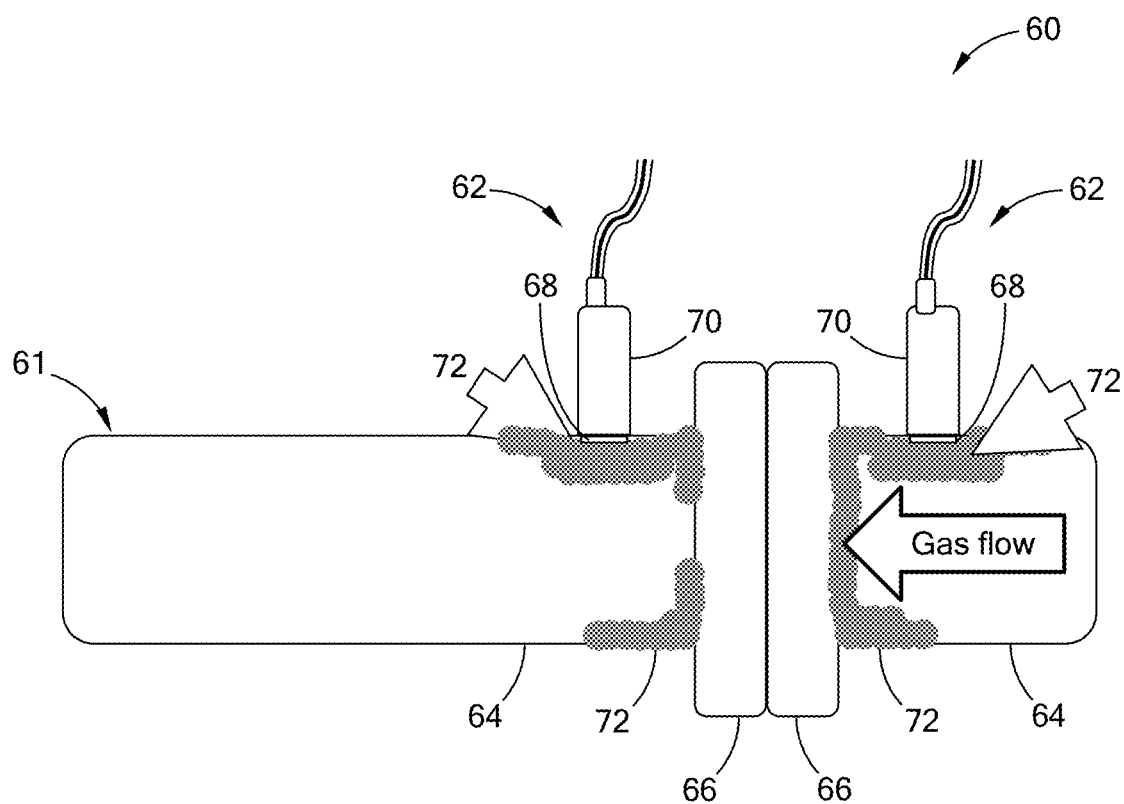
Figure 9A:
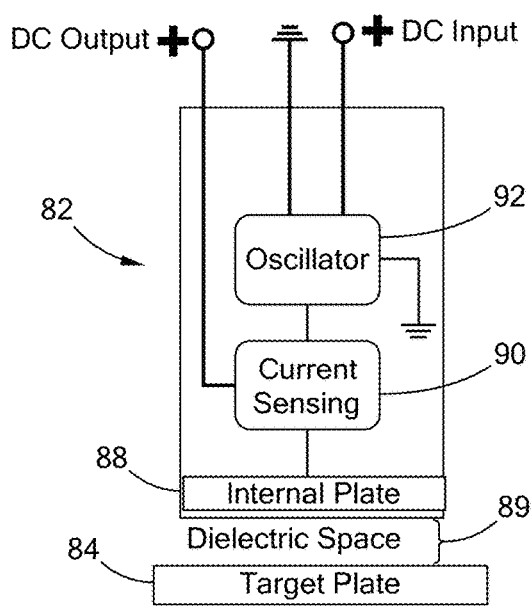
Figure 9B:
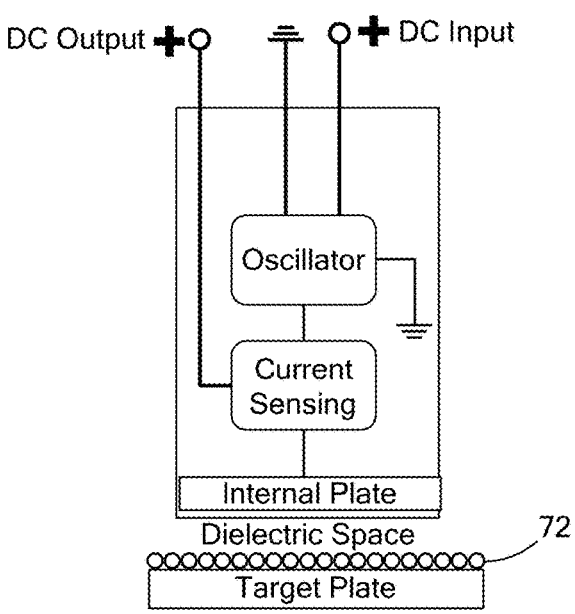
Figure 10:
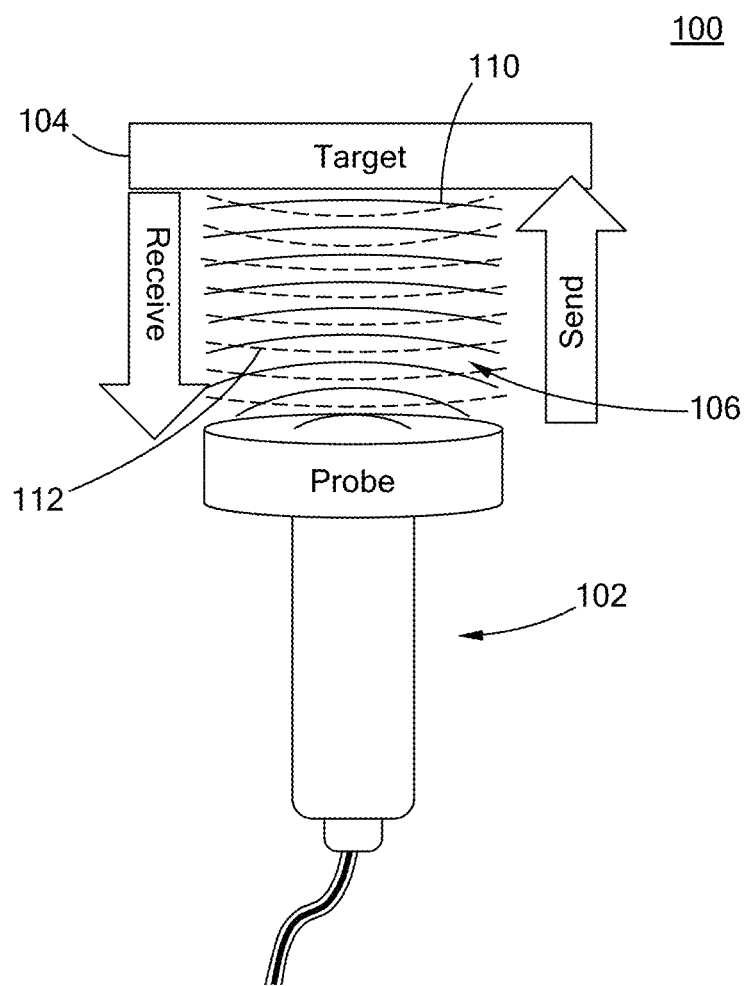
Figure 11:
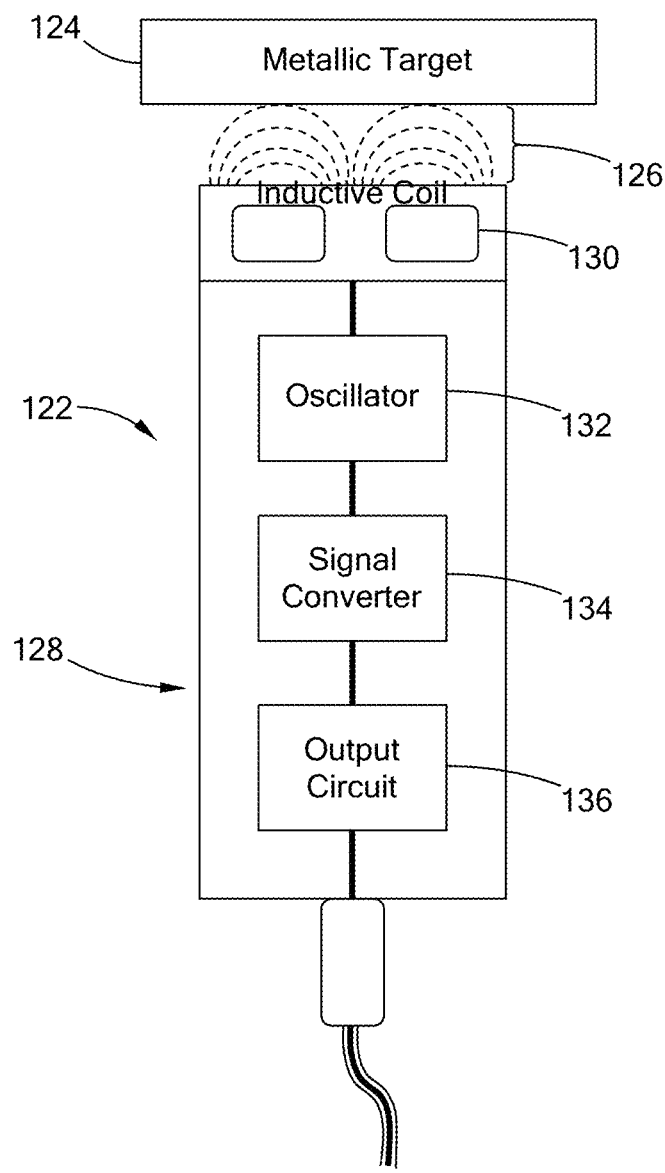
Figures 12A, 12B:
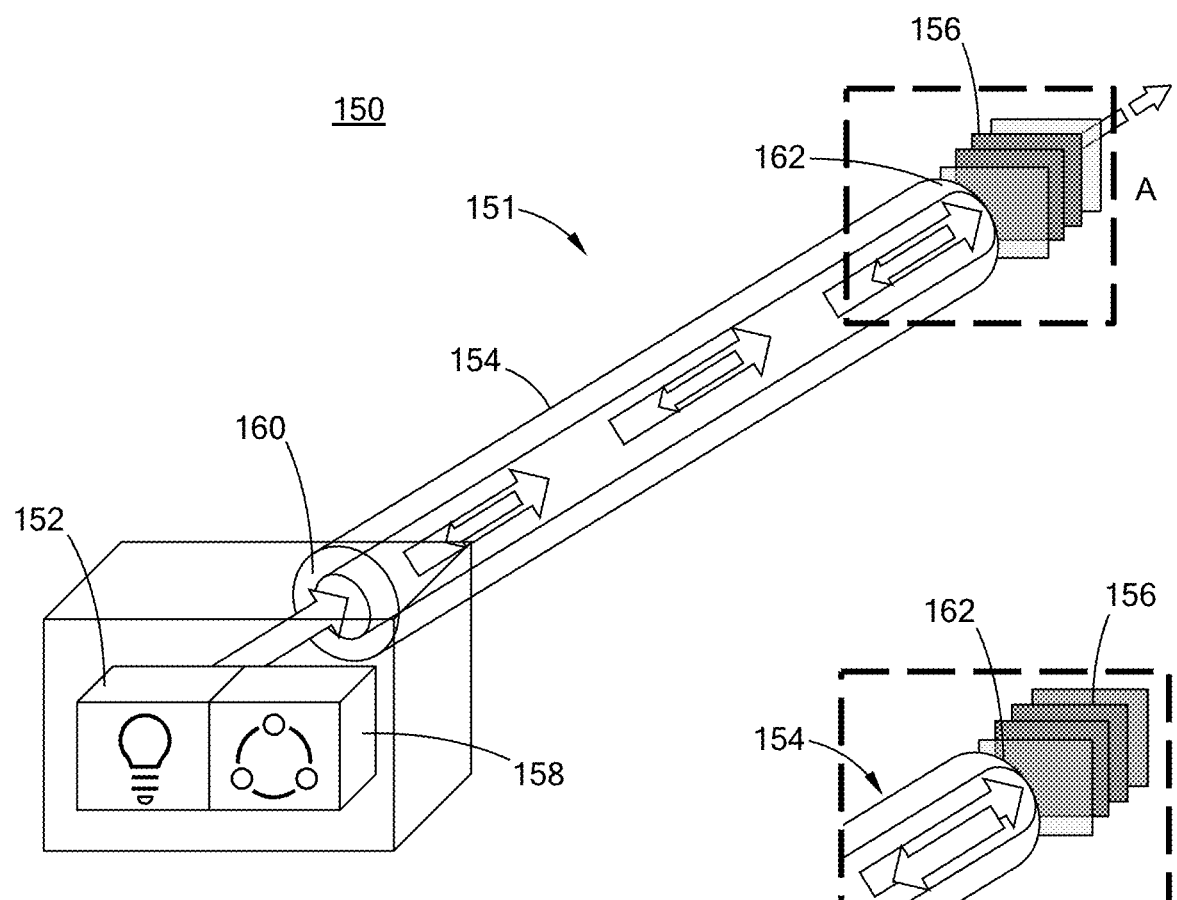
Figures 13A, 13B:
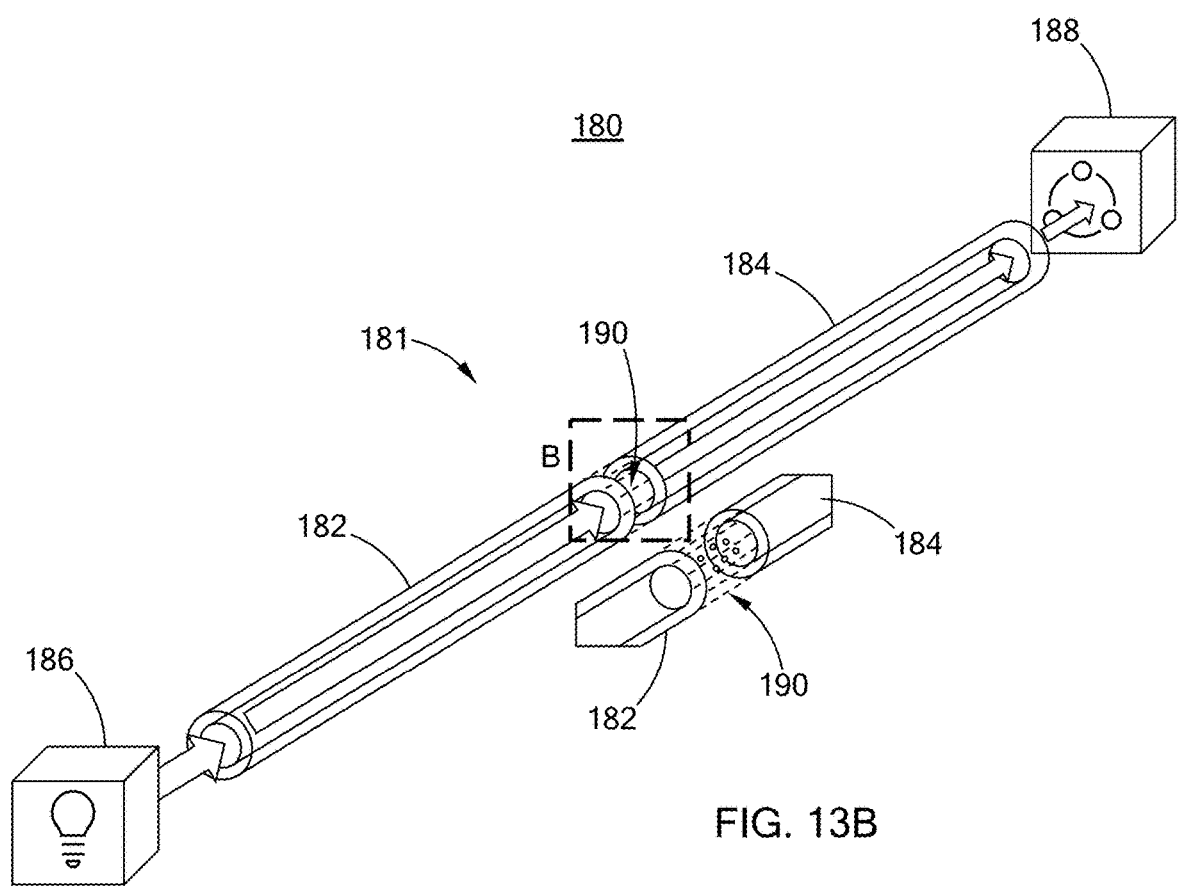
Figure 14A:
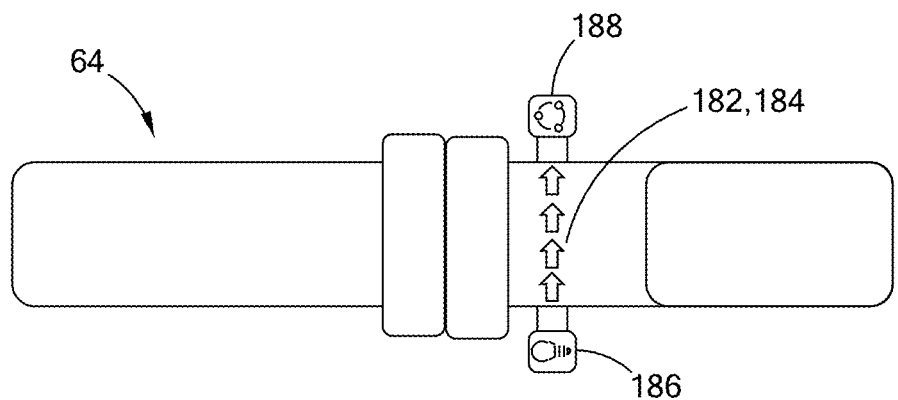
Figure 14B:
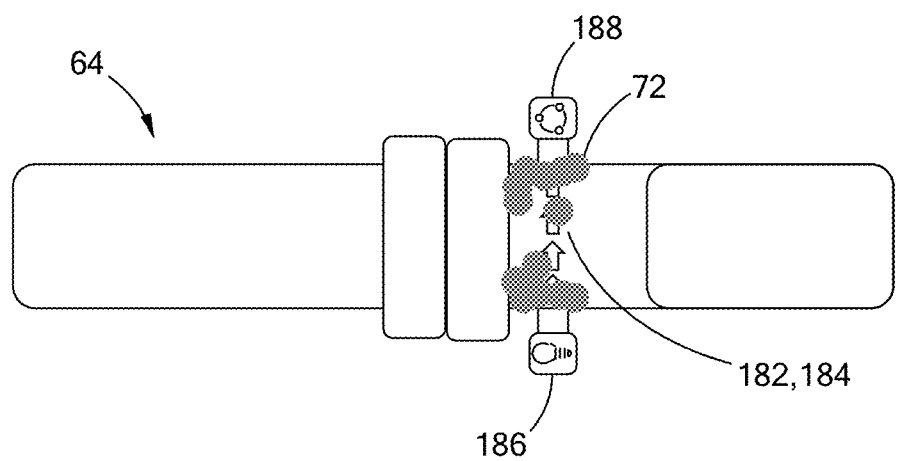
Figure 15:
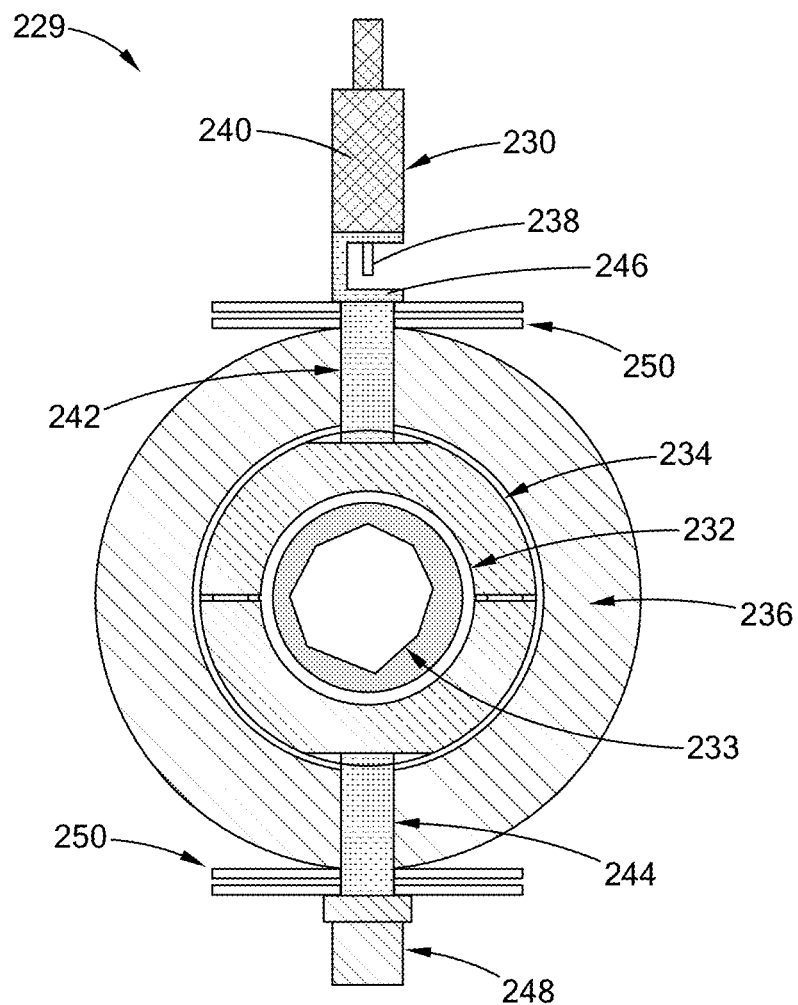
Figure 16:
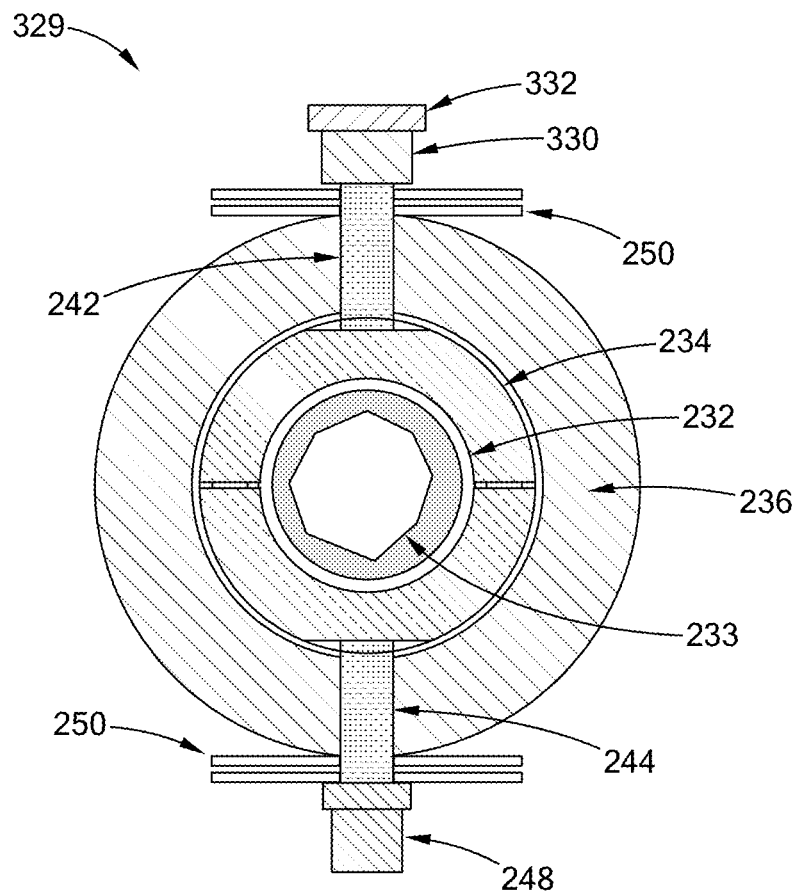

FIGS. 2A and 2B show a dual channel baseline vibration spectra taken from a transducer mounted on the pump when the pump was at rest, wherein the transducer may be equipped with one or more vibration sensing axes, each channel representing one or more signal measurements, wherein the baseline spectra of FIGS. 2A and 2B are dually represented as a "left" channel and a "right" channel, respectively, according to the teachings of the present disclosure;

FIGS. 3A and 3B show a dual channel baseline vibration spectra taken from a transducer mounted on the pump platform when the restricted valve was active and the residual gas analyzer (RGA) pump was running at 2 Torr, wherein the transducer may be equipped with one or more vibration sensing axes, each channel representing one or more signal measurements, wherein the baseline spectra of FIGS. 3A and 3B are dually represented as a "left" channel and a "right" channel, respectively, according to the teachings of the present disclosure;

FIGS. 4A and 4B show a dual channel baseline vibration spectra taken from a transducer mounted on the pump platform when the open valve was active and the RGA pump was running at 2 Torr, wherein the transducer may be equipped with one or more vibration sensing axes, each channel representing one or more signal measurements, wherein the baseline spectra of FIGS. 4A and 4B are dually represented as a "left" channel and a "right" channel, respectively, according to the teachings of the present disclosure;

FIGS. 5A and 5B show a dual channel baseline vibration spectra taken from a transducer mounted directly on the pump when the restricted valve was active and the RGA pump was running at 2 Torr, wherein the transducer may be equipped with one or more vibration sensing axes, each channel representing one or more signal measurements, wherein the baseline spectra of FIGS. 5A and 5B are dually represented as a "left" channel and a "right" channel, respectively, according to the teachings of the present disclosure;

FIGS. 6A and 6B show a dual channel baseline vibration spectra taken from a transducer mounted directly on the pump when the open valve was active and the RGA pump was running at 2 Torr, wherein the transducer may be equipped with one or more vibration sensing axes, each channel representing one or more signal measurements, wherein the baseline spectra of FIGS. 6A and 6B are dually represented as a "left" channel and a "right" channel, respectively, according to the teachings of the present disclosure;

FIG. 7 is a flow diagram illustrating a method of monitoring a condition of a dynamic system in accordance with the teachings of the present disclosure;

FIG. 8 is a schematic view of a monitoring system mounted on a process line for monitoring and predicting a condition of a process line and constructed in accordance with the teachings of the present disclosure;

FIGS. 9A and 9B are schematic views of a first form of a monitoring system for monitoring and predicting a condition of a process line and constructed in accordance with the teachings of the present disclosure, wherein FIG. 9A shows no condensation or precipitation is accumulated in the process line, and FIG. 9B shows condensation or precipitation is accumulated in the process line;

FIG. 10 is a schematic view of a second form of a monitoring system for monitoring and predicting a condition of a process line and constructed in accordance with the teachings of the present disclosure;

FIG. 11 is a schematic view of a third form of a monitoring system for monitoring and predicting a condition of a process line and constructed in accordance with the teachings of the present disclosure;

FIG. 12A is a schematic view of a fourth form of a monitoring system for monitoring and predicting a condition of a process line and constructed in accordance with the teachings of the present disclosure;

FIG. 12B is an enlarged view of portion A of FIG. 12A;

FIG. 13A is a schematic view of a fifth form of a monitoring system for monitoring and predicting a condition of a process line and constructed in accordance with the teachings of the present disclosure;

FIG. 13B is an enlarged view of portion B of FIG. 13A;

FIGS. 14A and 14B are schematic views showing the monitoring system of FIG. 13A is installed in a process line, wherein FIG. 14A shows no condensation or precipitation is accumulated in the process line, and FIG. 14B shows condensation or precipitation is accumulated in the process line to block a light transmission path;

FIG. 15 is a cross-sectional view of one form of an excitation device constructed in accordance with the teachings of the present disclosure; and FIG. 16 is a cross-sectional view of another form of an excitation device constructed in accordance with the teachings of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

Figure 1A:
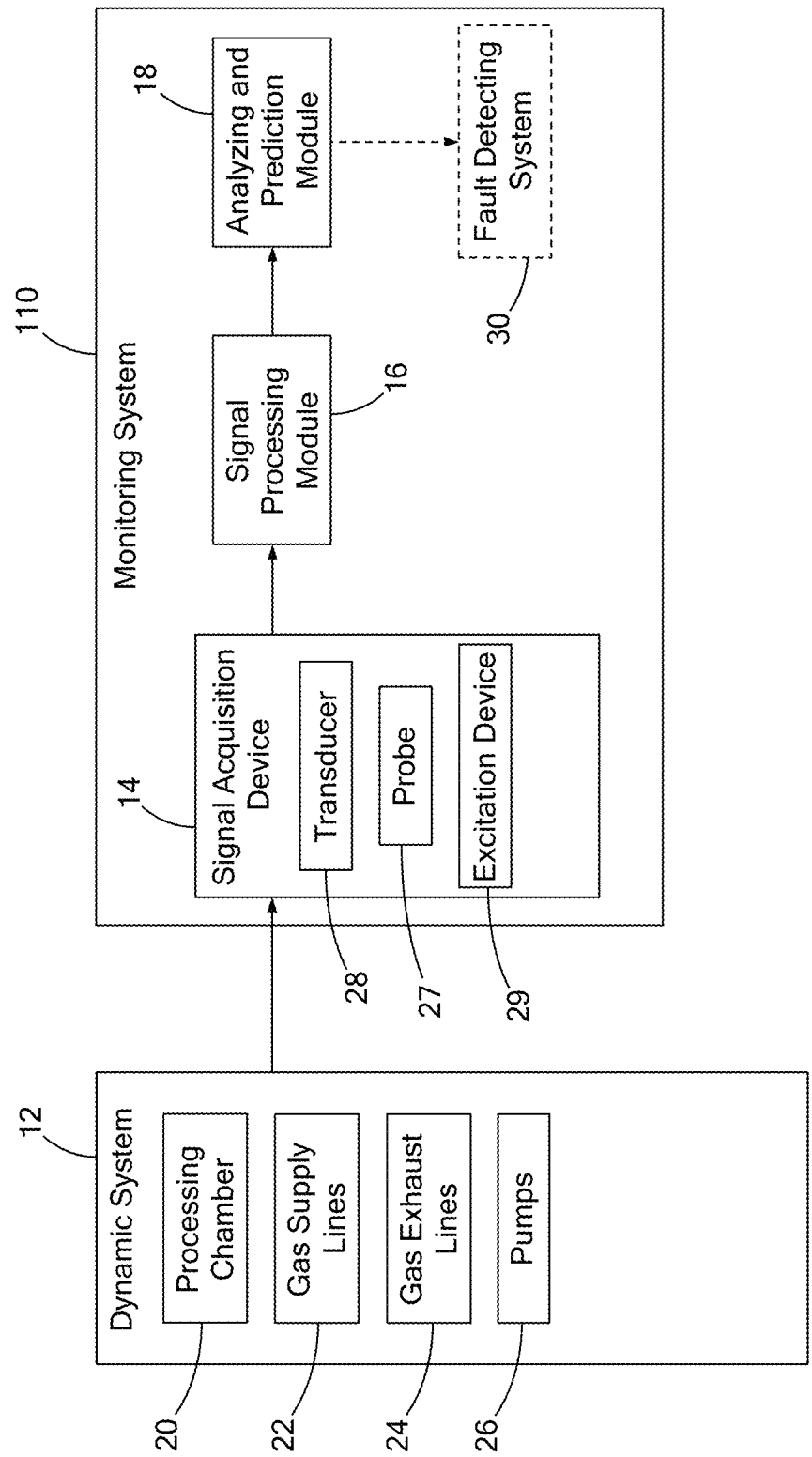
FIG. 1A is a schematic block diagram of a monitoring system for monitoring a condition of a dynamic system constructed in accordance with the teachings of the present disclosure.

Referring to FIG. 1A, a monitoring system 10 for monitoring a condition/behavior of a dynamic system 12 constructed in accordance with the teachings of the present disclosure includes a signal acquisition device 14 for acquiring signals from the dynamic system 12, a signal processing module 16, and an analyzing and predicting module 18 that analyzes the signals in a domain (for example a frequency domain when the signal is a frequency signal) and predicts the condition of the dynamic system 12 based on the signals in the domain.

In one form, the signal acquisition device 14 is a vibration signal acquisition device 14 that acquires vibration signals while the signal processing module 16 is vibration signal processing module 16. It should be understood that other types of signals, such as by way of example, temperature, pressure, and mass flow rate, among others, are within the teachings of the present disclosure.

Figure 1B:
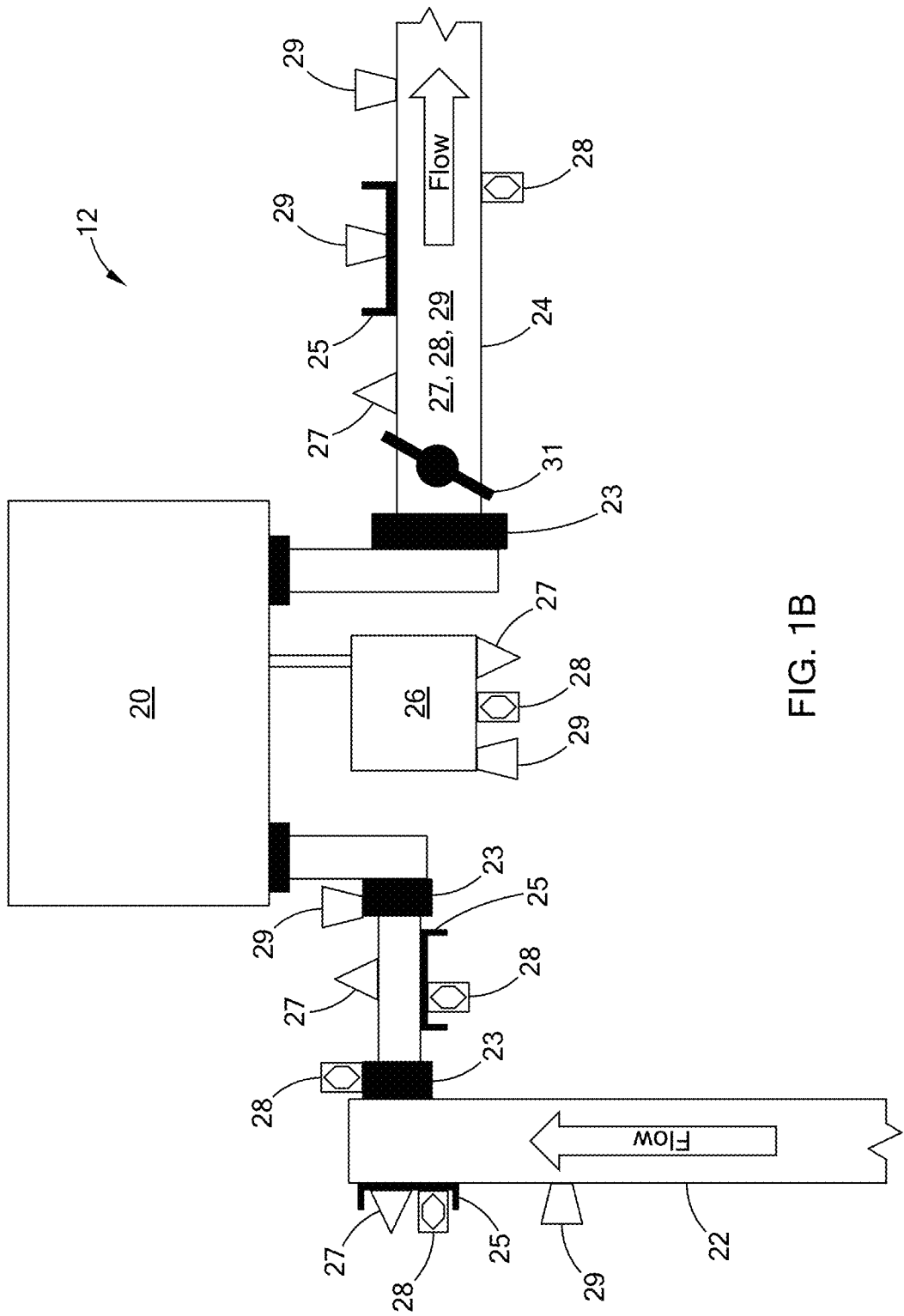
FIG. 1B is a schematic view of a dynamic system, according to the teachings of the present disclosure.

Referring to FIG. 1B, the dynamic system 12 in one form is a semiconductor processing system that includes a processing chamber 20, a plurality of gas lines including gas supply line 22, and gas exhaust line 24 (also referred to generically for any application as "fluid flow conduits"), and pumps 26 (only one shown) disposed adjacent to the gas exhaust lines 24. The pump 26 may be any configuration of a vacuum pump such as they type used within a residual gas analyzer (RGA) system. As further shown, a number of fittings 23 couple different components of the dynamic system 12 to each other.

Processing gases are supplied into the processing chamber 20 through the gas supply line 22 during various processing steps. After each processing step, the processing gases are removed from the processing chamber 20 through the gas exhaust lines 24. The gas exhaust line 24 in one form includes a bypass valve 31. The gas exhaust line 24 can thus be controlled to be in an open condition or a choked condition by operating the bypass valve 31. Further, a plurality of gas supply lines 22 and/or gas exhaust lines 24 may be employed even though only one of each is illustrated and described herein.

It should be understood that this semiconductor processing system is merely exemplary of a fluid flow system to which the teachings of the present disclosure may be employed. Many other fluid flow systems including supply lines and cooling lines, among others, and for other industrial processes such as machining, injection molding, combustion exhaust systems, and HVAC, among others, may also employ the teachings of the present disclosure. Therefore, the use of a semiconductor processing system should not be construed as limiting the scope of the present disclosure. Further, the term "fluid" should be construed to mean any state of matter of a substance, including gas, liquid, and plasma.

The signal acquisition device 14 may include a transducer 28 disposed adjacent to the gas exhaust lines 24 to acquire signals of the gas exhaust lines 24 in a frequency domain. In this form, the transducer 28 is outside the gas exhaust lines 24. However, because cross-contamination is not an issue with the exhaust side of semiconductor processing systems, a probe 27 to detect a phase change of the fluid may be placed inside the gas exhaust lines 24 while remaining within the scope of the present disclosure. This probe 27 could also include, by way of example, a temperature sensor, an optical sensor, or the pressure transducer 28 as described herein, among others.

In one variation of the present disclosure, a plurality of external excitation devices 29 are placed adjacent to or inside the gas exhaust lines 24, along the length thereof. The excitation devices 29 ping (e.g. excite, ring, strike) gas exhaust line 24, thus enabling monitoring system 10 to measure the frequency response between the gas exhaust lines 24 and the excitation devices 29 to detect clogs, clogging, and flow reductions/restrictions. In one form, the excitation devices 29 are configured as calibrated impact devices (e.g. instrumented hammer).

In another form, the excitation device 29 may be a vibration motor. The vibration motor is operated at different frequencies to identify clogs based on a comparison of the different vibration motor frequencies as compared with a natural frequency of the dynamic system 12.

In still another form, the excitation device 29 is a pump that varies a fluid flow rate through the gas exhaust lines 24 to induce vibration for clog detection. For example, when fluid flow is choked or restricted, vibration is induced, and thus the vibration response can be analyzed to determine the presence of clogs. Each of these various forms of excitation devices 29 are illustrated and described in greater detail below.

Generally, changes in flow rates, pump speeds, motor speeds, and similar vibrational/dynamic alterations are measurable excitation devices that enable predictive clog detection according to the teachings of the present disclosure.

The in-situ excitation measurements enable a 4D (length, width, depth, time) mapping of the flow when coupled with a graphical user interface or as little as a flow rate (actual, estimated, approximate minimum, approximate maximum) at a given location within the dynamic system at a given time. Consequently, as the number of measurement locations increases the fidelity of the 4D maps, diagnoses, and prognoses improves. The fidelity also improves with time as the monitoring system is able to measure the differences between the various clogged states of the dynamic system 12 (e.g. completely clean to clog induced shutdown). The improved diagnoses and prognoses detect and monitor buildup to transform many clogs into filter changes or less immediate maintenance activities thus increasing production time.

Solidification of particulates may occur in the dynamic system 12 over time. Solidification of particulates leads to a narrower passage for the gas to flow through the fluid flow conduits, resulting in "clogging" or blocking flow of fluid through the fluid flow conduits. In the semiconductor processing system example shown, most of the "clogging" occurs or near an atmospheric exhaust side, primarily because the exhaust lines 24 are not backed by the pumps but rather by "house" exhaust. When buildups occur in the gas exhaust lines 24, the output pressure (back pressure) of the pumps will increase over time, resulting in a change in vibration of the gas exhaust lines 24. Therefore, signals relating to vibration of the gas exhaust lines 24 may be used to predict unintentional restriction changes in the exhaust gas lines due to solidification of particulates that narrows the gas passage in the gas exhaust lines 24. According to the teachings of the present disclosure, the restriction of the gas exhaust lines 24 can be correlated to the vibration pattern of the gas exhaust lines 24.

The signal processing module 16 may be a data acquisition (DAQ) system for sampling the signals transmitted from the transducers 28 and converting the signals into a form that can be converted to digital values. As an example, the signal processing module 16 may include a signal conditioning circuit for converting vibration signals into a form that can be converted to digital values, and an analog-to-digital converter for converting the conditioned vibration signals to digital values.

In another form, when the signal acquisition device 14 includes an accelerometer to acquire vibration signals in a time domain, the signal processing module 16 may further include a Fourier transform algorithm to convert vibration signals from the time domain (amplitudes as a function of time) into a frequency domain (amplitude as a function of frequency).

The analyzing and predicting module 18 analyzes the vibration signals in the frequency domain (vibration spectrum) and predicts a condition of the gas exhaust lines 24 based on the vibration spectrum. The analyzing and predicting module 18 may include a computer having a processor. The vibration spectra generate a unique vibration signature correlated with a specific amplitude and frequency range (frequency domain). The system behavior of the dynamic system 12 can be tuned and predicted by understanding and analyzing this signature. The analyzing and predicting module 18 analyzes the vibration signature and predicts whether an anomaly occurs in the gas exhaust lines 24 based on the vibration spectra.

Referring to FIGS. 2A to 6B, the transducers 28 acquire the vibration signals in the frequency domain (amplitude dBFS vs. frequency Hz) of the RGA pump under different test conditions. More specifically, the dynamic system 12 may be operated under two valve conditions (open valve and restricted valve conditions) with transducers 28 disposed directly onto the pump or on the pump platform and with the RGA pump running or at rest.

FIGS. 2A and 2B show vibration signals in the frequency domain (i.e., vibration spectra) taken from one or more transducers that are mounted on the pump when the pump was at rest. One or more transducers may be mounted anywhere on or near the signal measurement(s) of interest and used to represent or correlate to data points of interest. For example, a dual channel baseline vibration spectra may be taken from a transducer 28 mounted on the pump 26. For each transducer equipped with one or more vibration sensing axes, each channel may represent one or more signal measurements.

In FIGS. 2A and 2B, the baseline spectra indicate one signal that was taken when the pump was at rest and dually represented as a "left" channel and a "right" channel, where one channel scales the signal to ±20 g full scale and the other channel scales the same signal to ±10 g full scale. These vibration spectra are baseline vibration spectra which serve as a reference to be compared by the vibration spectra for the different test conditions.

In order to effectively use vibration data for condition monitoring, a baseline vibration spectrum should be established. Some vibrations may be benign in nature and have no impact on the lifetime or performance of the dynamic system 12. A baseline vibration spectrum is a vibration spectrum for the vibrations that are benign and that can be used as a reference for comparison purposes.

FIGS. 3A and 3B include vibration spectra for the test conditions when the bypass valve was partially closed and the RGA pump was running at 2 Torr, where the transducer 28 is installed on a pump platform. FIGS. 4A and 4B include vibration spectra for the test conditions when the bypass valve was open and the RGA pump was running at 2 Torr, where the transductors were installed on a pump platform. FIGS. 5A and 5B include vibration spectra under the test conditions when the bypass valve 31 was partially closed and the RGA pump was running at 2 Torr, where the transducer was placed directly on the RGA pump. FIGS. 6A and 6B include vibration spectra under the test conditions when the bypass valve was open and the RGA pump was running at 2 Torr, where the transducer was placed directly on the RGA pump.

The analyzing and predicting module 18 is configured to perform a correlation process to determine correlations between the vibration spectra and the condition (open or choked valve) of the dynamic system 12. The correlation process starts with identifying peaks (frequency spikes, frequency peaks) on the vibration spectra. The frequency spikes can be correlated to physical characteristics of the dynamic system, such as solidification by condensation in the piping system.

As shown in FIGS. 3A to 4B, a significant peak increase in the open valve condition in the 100-200 Hz frequency range when the transducer is placed on the pump platform. As shown in FIGS. 5A to 6B, when the transducer is placed directly onto the pump instead of the previous location on the pump platform, the vibration spectra show the peak is more distinct and thus provide higher resolution spectra. Therefore, when the transducer is placed directly on the pump, a more detailed and accurate correlation of the choke condition of the valve and the overall frequency domain to the activity of the pump can be obtained.

The monitoring system 10 can detect overall performance of the dynamic system, such as the pump and the gas lines over time. Any significant anomalies and failures can be detected right away. This would also allow for a better response time and improve operational lifetime of the dynamic system 12.

The monitoring system 10 may be further configured to include a fault detection system 30 that provides a warning to the user to help prevent unanticipated failure and line shutdown. The monitoring system 10 may also be connected to a heater system disposed adjacent to the gas lines. The heater system may be activated in response to the warning to remove the buildups in the gas exhaust lines. Alternately, the line can be purged with a high flow rate of treated gas such as N2 to agitate and remove buildup in the gas exhaust lines.

Referring to FIG. 7, a method 40 of monitoring a condition of a dynamic system starts with placing a vibration signal acquisition device (such as a transducer) at a predetermined location of the dynamic system in step 42. The predetermined location can be a location at a pump, at a pump platform, or at a gas exhaust pipe. The vibration signals in the frequency domain (vibration spectra) are acquired by the transducers under various test conditions in step 44. The vibration spectra are analyzed to identify frequency spikes in step 46. The vibration spectra are correlated to the conditions of the dynamic system in step 48.

Referring to FIG. 8, a monitoring system 60 for monitoring and predicting a condition (such as condensation or precipitation of materials) of a process line 61 and constructed in accordance with the teachings of the present disclosure may include one or more proximity sensors 62, and one or more target plates 68 (target elements) corresponding to the one or more proximity sensors 62. The process line 61 may include a plurality of tubular portions 64 connected by mounting flanges 66 at ends of the tubular portions 64. The process line 61 may be in fluid communication with a pump or an exhaust system (not shown). The monitoring system 60 may be disposed adjacent to the mounting flanges 66 to facilitate mounting of the target plates 68 inside the process line 61. The target plates 68 are disposed inside the process line 61 and are exposed to a processing gas flowing in the process line 61 as well as condensation or precipitation 72 of materials that may accumulate in the process line 61 over time.

The proximity sensor 62 includes a sensor body 70 for monitoring electric properties of the target plates 68. When condensation or precipitation 72 is accumulated in the process line 61, the condensation or precipitations 72 is also accumulated on the target plates 68, thereby affecting the electrical properties of the target plates 68. Generally, the changed electrical property of the target plates 68, such as its resistance, provides an indication of the condition or status of the condensation or precipitation 72 in the process line 61.

Referring to FIGS. 9A and 9B, a first form of a monitoring system 80 for monitoring and predicting a condition of a process line and constructed in accordance with the teachings of the present disclosure includes a proximity sensor 82 in the form of a capacitance displacement or capacitive proximity sensor, and a target plate 84 opposing the proximity sensor 82 and disposed inside the process line 61. The proximity sensor 82 includes a sensor body for receiving an internal plate 88, a current sensing element 90, and an oscillator 92 therein. The target plate 84 is disposed in the process line 61 and external of the sensor body. An empty space 89 (dielectric space) is defined between the target plate 84 and the internal plate 88. Both the target plate 84 and the internal plate 88 function as electrodes of a capacitor.

When a DC voltage is applied to the internal plate 88, electric charges are accumulated on the target plate 84. The amount of electric charges accumulated on the target plate 84 is dependent on the voltage applied to the internal plate 88, the surface area of the target plate 84, and the dielectric constant of the empty space 89. The charges buildup on the target plate 84 induce AC current in the internal plate 86. Any condensation or precipitation 72 will change the density and distribution of the electric charges on the target plate 84, thereby affecting the current flowing in the internal plate 86. By using the current sensing element 90 to measure the electric current induced by the buildup charges, the condition of the target plate 84 and consequently the condition of the process line 61 can be monitored and predicted.

Referring to FIG. 10, a second form of a monitoring system 100 for monitoring and predicting a condition of a process line and constructed in accordance with the teachings of the present disclosure includes a proximity sensor 102 in the form of an ultrasonic proximity sensor, and a target plate 104 disposed inside the process line and opposing the proximity sensor 102 to define an empty space 106 therebetween. In one form, the ultrasonic proximity sensor 102 may include a piezoelectric element (not shown). When an AC voltage is applied to the piezoelectric element, the AC voltage causes the piezoelectric element to constantly change size and shape and makes the piezoelectric element oscillate at the same frequency to produce ultrasonic sound. The ultrasonic sound waves 110 (shown in sold lines) are sent towards the target plate 104. When the target plate 104 is hit by the ultrasonic sound waves 110, the reflected waves 112 (shown in dashed lines) produces echoes. When condensation or precipitation is accumulated on the target plate 104, the state of the target plate 104 and the empty space 106 between the target plate 104 and the ultrasonic proximity sensor 102 are changed. By monitoring and evaluating the state of the target plate 104 and the empty space 106 between the target plate 104 and the ultrasonic proximity sensor 102, the condition of the target plate 104 and consequently the condition of the process line 61 can be determined and predicted.

Referring to FIG. 11, a third form of a monitoring system 120 for monitoring and predicting a condition of a process line and constructed in accordance with the teachings of the present disclosure includes a proximity sensor 122 in the form of an inductive proximity sensor, and a metallic target plate 124 disposed inside the process line and opposing the proximity sensor 122 to define an empty space 126 therebetween. The proximity sensor 122 includes a sensor body 128 defining a sensor chamber for receiving an inductive coil 130, an oscillator 132 that creates an electromagnetic field, a signal converter 134, and an output circuit 136 therein. The inductive coil 130 is disposed opposing the metallic target plate 124 to define the empty space 126 therebetween. The metallic target plate 124 is disposed inside the process line and the empty space 126 is located in the process line. When voltage is applied to the inductive coil 130, an eddy current is generated in the metallic target plate 124. The eddy current on the metallic target plate 124 will dampen the amplitude of the oscillation signals generated by the oscillator 132. When condensation or precipitation 72 is accumulated on the metallic target plate 124, the size of the empty space 126 is reduced, resulting in a decrease in the amplitude of the oscillation signals. By monitoring and evaluating the amplitude of the oscillation signals, the condition of the metallic target plate 124 and consequently the condition of the process line may be monitored and predicted.

Referring to FIGS. 12A and 12B, a fourth form of a monitoring system 150 for monitoring and predicting a condition of a process line and constructed in accordance with the teachings of the present disclosure includes an optical sensor 151. The optical sensor 151 includes a light source 152 (such as an LED), a fiber optic cable 154, a two-way mirror 156, and an analyzer 158. The light source 152 and the analyzer 158 are disposed at a first end 160 of the fiber optic cable 154. The two-way mirror 156 is disposed at a second end 162 of the fiber optic cable 154 opposing the first end 160. The two-way mirror 156 is disposed inside the process line and is exposed to condensation or precipitation that may be accumulated in the process line over time. The fiber optic cable 154 may be oriented longitudinally along the length of the process line or radially across the process line as long as the two-way mirror 156 is disposed inside the process line.

The light source 152 emits light pulses through the fiber optic cable 154 toward the two-way mirror 156. A portion of the light from the light source 152 is transmitted through the two-way mirror 156, while the remaining portion of the light is reflected by the two-way mirror 156 back to the first end 160 of the fiber optic cable 154. The analyzer 158 at the first end 160 receives the reflected light and determines a ratio of the intensity of the light transmitted through the two-way mirror 156 to the intensity of the light reflected by the two-way mirror 156.

When condensation or precipitation is accumulated in the process line, the condensation or precipitation is also accumulated on the two-way mirror 156 and affects the transmission characteristics of the two-way mirror 156. Precipitation can block transmission of light through the two-way mirror 156. When condensation or precipitation occurs, a larger portion of the light is reflected back to the analyzer 158. Therefore, the ratio of the intensity of the transmitted light to the intensity of the reflected light provides an indication of the surface condition of the two-way mirror 156, and consequently the condition/status of the process line. This ratio may be used to correlates to the level of obstruction in the process line.

Referring to FIGS. 13A and 13B, a fifth form of a monitoring system 180 for monitoring and predicting a condition of a process line and constructed in accordance with the teachings of the present disclosure includes an optical sensor 181. The optical sensor 181 includes a first fiber optic cable 182, a second fiber optic cable 184, a light source 186 (such as an LED), and an analyzer 188. The first and second fiber optic cables 182 and 184 are disposed end to end to define a gap 190 therebetween. The length of the first and second fiber optic cables 182 and 184 can be adjusted in order to change the size of the gap 190. The gap 190 is located in the process line and is exposed to condensation or precipitation that may be accumulated in the process line.

The light source 186 is disposed at an end of the first fiber optic cable 182 distal from the gap 190. The analyzer 188 is disposed at an end of the second fiber optic cable 184 distal from the gap 190. The analyzer 188 can measure the intensity of transmitted light from the first fiber optic cable 182 to the second fiber optic cable 184. The light intensity received by the analyzer 188 may be used to correlate to the condition of the process line and provide an indication of the level of obstruction in the process line.

Referring to FIGS. 14A and 14B, the first and second fiber optic cables 182 and 184 extend across the process line with the gap 190 disposed inside the process line and with the light source 186 and the analyzer 188 disposed outside the process line. When condensation or precipitation is accumulated in the process line, the condensation or precipitation is also accumulated in the gap 190 between the first and second fiber optic cables 182 and 184, affecting the transmission of the light pulse from the light source 186 to the analyzer 188. When more condensation is accumulated in the gap 190, less light is transmitted from the light source 186 to the analyzer 188. The analyzer 188 can determine and predict the amount of condensation or precipitation 72 in the process line 61 by measuring and determining the amount of light transmitted through the gap 190. The gap 190 can control the width of test area within the process line.

In another form, the first and second fiber optic cables 182 and 184 can extend along the process line rather than across as shown in FIGS. 14A and 14B. In this form, the first and second fiber optic cables 182 and 184 and related components can be integrated into the mounting flanges 66 (see FIG. 8) such that the design is modular and can be implemented more easily.

Referring now to FIG. 15 one form of an excitation device is illustrated and generally indicated by reference numeral 229. As shown, the excitation device 229 includes a hammer solenoid 230 mounted to conduit 232 via a clamp 234, which is surrounded by thermal insulation 236. The conduit 232 is shown with deposits or build-ups 233, which are clogging/blocking fluid flow through the conduit 232, and the excitation device 229 is used to detect these deposits.

The hammer solenoid 230 includes a moveable post 238, which is extended and retracted by a solenoid mechanism (not shown) within a solenoid body 240. The hammer solenoid 230 further includes an upper thermal extension 242 and a lower thermal extension 244, which provide for physical contact with the conduit 232 as shown, as well as thermal separation between the solenoid body 240 and the conduit 232. A platform 246 extends between the solenoid body 240 and the upper thermal extension 242, providing a striking surface for the moveable post 238. Further, a vibration sensor 248 is secured to the lower thermal extension 244 and is configured to measure vibrational responses as the moveable post 238 from the hammer solenoid 230 strikes the platform 246. For example, the vibrational response may be amplitude in a frequency domain or a decay rate in a time domain.

A change in response signal amplitude or frequency decay rate can then be correlated with an amount of deposits or material build-ups within the conduit 232. For example, vibrational responses can be baselined for a clean/clear conduit, and then changing amplitudes in a frequency domain or changing decay rates in a time domain can then indicate the presence and amount of deposits. Results from the vibrational responses can be translated to user interfaces (not shown), for example a bar graph display on an instrument, which can show a percentage of clogging based on the vibrational responses.

In one form, the hammer solenoid 230 is a pulse hammer solenoid with a striking frequency between about 50-500 milliseconds. And as further shown, the excitation device 229 may also include optional cooling fins 250 secured around the upper thermal extension 242 and/or the lower thermal extension 244. One or more of the excitation devices 229 may be placed along the conduit 232, or proximate any other component of a dynamic system 12 (such as, by way of example, the components of a semiconductor processing system as described above) while remaining within the scope of the present disclosure.

Referring to FIG. 16, another form of an excitation device is illustrated and generally indicated by reference numeral 329. Rather than a hammer solenoid as previously described, the excitation device 329 in this form is a piezoelectric stack transducer (PZT) 330. (Similar elements to those described above are illustrated in this figure with the same element numbers and will not be described again for purposes of clarity). The PZT 330 further includes an opposing mass 332 as shown. Optionally, an Eccentric Rotating Mass (ERM) or a Linear Resonant Actuator (LRM) (not shown) may be employed with the PZT 330 as a vibroacoustic signal source.

In one form, the PZT 330 is energized with a pulse of steady state frequency or a steady state constant frequency that is not a resonant frequency of the conduit 232 or dynamic system 12. The vibration sensor 248 then measures vibrational responses as set forth above. In one form, a sweep frequency analysis can be conducted. Similarly, a user interface (not shown) can be employed as set forth above.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, manufacturing technology, and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A method of monitoring a condition of a dynamic system, the method comprising:
    generating a vibration spectrum based on vibration signals acquired from a vibration signal acquisition device, the vibration signal acquisition device being located at a predetermined location of the dynamic system;
    determining a plurality of amplitude differences between the vibration spectrum and a baseline vibration spectrum for a plurality of frequency values, wherein each amplitude difference from among the plurality of amplitude difference is associated with a given frequency value from among the plurality of frequency values;
    identifying, in a frequency domain, a frequency peak based on a largest amplitude difference from among the plurality of amplitude differences;
    correlating the frequency peak to a presence of the clog of the dynamic system; and
    selectively removing the clog based on the presence of the clog.

2. The method according to claim 1, wherein the dynamic system includes a processing chamber and a gas exhaust line, and wherein the predetermined location is a location adjacent to the gas exhaust line.

3. The method according to claim 2, wherein the predetermined location is a location directly on a pump in fluid communication with the gas exhaust line.

4. The method according to claim 2, wherein the predetermined location is a location on a pump platform.

5. The method according to claim 1, further comprising obtaining a plurality of vibration spectra under a plurality of test conditions.

6. The method according to claim 1, wherein the vibration signal acquisition device includes a transducer.

7. The method according to claim 1, further comprising analyzing the vibration signals using a vibration signature analysis module.

8. The method according to claim 1, further comprising processing the vibration signals by a digital data acquisition (DAQ) system.

9. The method according to claim 1, further comprising obtaining a baseline vibration spectrum when the dynamic system is operating and a pump is at rest.

10. The method according to claim 1, wherein selectively removing the clog further comprises activating a heater to remove the clog.

11. The method according to claim 1 further comprising introducing vibration into the dynamic system with at least one excitation device.

12. The method according to claim 11 further comprising a plurality of excitation devices spaced along a fluid flow conduit of the dynamic system.

13. The method according to claim 12, wherein the plurality of excitation devices are instrumented hammers.

14. The method according to claim 11, wherein the at least one excitation device is a vibration motor.

15. The method according to claim 11, wherein the at least one excitation device is a pump.

16. A system for clog detection in a fluid flow conduit of a dynamic system, the system for clog detection comprising:
    a plurality of operational components;
    a vibration signal acquisition device disposed at a predetermined location of at least one of the plurality of operational components, the vibrational signal acquisition device configured to acquire vibration signals associated with the plurality of operational components; and
    a controller configured to:
        generate a vibration spectrum based on the vibration signals;
        determine a plurality of amplitude differences between the vibration spectrum and a baseline vibration spectrum for a plurality of frequency values, wherein each amplitude difference from among the plurality of amplitude difference is associated with a given frequency value from among the plurality of frequency values;
        identify, in a frequency domain, a frequency peak based on a largest amplitude difference from among the plurality of amplitude differences;
        determine a presence of a clog based on the frequency peak; and
        selectively broadcast a command to remove the clog based on the presence of the clog, wherein the command includes at least one of activating a heater to remove the clog and introducing a gas within the fluid flow conduit to remove the clog.

17. The system according to claim 16 further comprising at least one excitation device.

18. The system according to claim 17 further comprising a plurality of excitation devices spaced along the fluid flow conduit of the dynamic system.

19. The system according to claim 17, wherein the excitation device is a hammer solenoid.

20. The system according to claim 17, wherein the excitation device is a piezoelectric stack transducer.

* * * * *